(12) United States Patent
Jang et al.

(10) Patent No.: US 12,367,826 B2
(45) Date of Patent: Jul. 22, 2025

(54) DISPLAY DEVICE AND DRIVING METHOD THEREOF

(71) Applicant: Samsung Display Co., Ltd., Yongin-si (KR)

(72) Inventors: Yun Jang, Yongin-si (KR); Yun Hee Park, Yongin-si (KR); Yi Seop Shim, Yongin-si (KR); Hyun Seung Lee, Yongin-si (KR); Kyu Won Jo, Yongin-si (KR); Kyung Seon Tak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 42 days.

(21) Appl. No.: 18/320,037

(22) Filed: May 18, 2023

(65) Prior Publication Data
US 2024/0071306 A1 Feb. 29, 2024

(30) Foreign Application Priority Data

Aug. 24, 2022 (KR) .................. 10-2022-0106428

(51) Int. Cl.
*G09G 3/3233* (2016.01)
*H10K 59/124* (2023.01)

(52) U.S. Cl.
CPC ......... *G09G 3/3233* (2013.01); *H10K 59/124* (2023.02); *G09G 2300/0452* (2013.01);
(Continued)

(58) Field of Classification Search
CPC .................. G09G 3/3233; G09G 3/32; G09G 2300/0452; G09G 2300/0456;
(Continued)

(56) References Cited

U.S. PATENT DOCUMENTS

2002/0085143 A1* 7/2002 Kim .................. G02F 1/133603
349/61
2008/0030495 A1* 2/2008 Shirasaki ............. G09G 3/3233
345/78
(Continued)

FOREIGN PATENT DOCUMENTS

WO WO 2017/070690 A1 4/2017

OTHER PUBLICATIONS

Feng, Jiabin et al., "Injection-free multiwavelength electroluminescence devices based on monolayer semiconductors driven by an alternating field"; Science Advances; Feb. 2, 2022; pp. 1-8; vol. 8, Issue 5; American Association for the Advancement of Science.
(Continued)

*Primary Examiner* — Shaheda A Abdin
(74) *Attorney, Agent, or Firm* — Womble Bond Dickinson (US) LLP (57) ABSTRACT

A display device according to one or more embodiments of the disclosure includes a pixel circuit layer including a base layer and circuit elements on the base layer; and a display layer on the pixel circuit layer. The display layer includes a first electrode on the pixel circuit layer; an insulating layer on the first electrode; a second electrode on the insulating layer; a light emitting stacked structure on the second electrode and including a first insulating layer, a second insulating layer, and a light emitting layer between the first insulating layer and the second insulating layer; and a third electrode on the light emitting stacked structure. The light emitting layer includes a two-dimensional material, is separated from the second electrode by the first insulating layer, and is separated from the third electrode by the second insulating layer.

18 Claims, 10 Drawing Sheets

(52) U.S. Cl.
CPC ........... *G09G 2300/0842* (2013.01); *G09G 2320/0626* (2013.01)

(58) Field of Classification Search
CPC ..... G09G 2300/023; G09G 2300/0842; G09G 2320/0626; H10K 59/124
See application file for complete search history.

(56) References Cited

U.S. PATENT DOCUMENTS

| | | | |
|---|---|---|---|
| 2010/0178722 A1* | 7/2010 | de Graff | H10F 39/026 438/73 |
| 2010/0311502 A1* | 12/2010 | Miller | A63F 1/02 463/30 |
| 2014/0152801 A1* | 6/2014 | Fine | H04N 7/18 348/79 |
| 2015/0171153 A1* | 6/2015 | Yoon | H10K 50/816 257/40 |
| 2015/0382484 A1* | 12/2015 | Jung | H04M 1/0266 361/752 |
| 2017/0125502 A1* | 5/2017 | Ota | G09G 3/3291 |
| 2019/0210881 A1 | 7/2019 | Tung et al. | |
| 2021/0343817 A1* | 11/2021 | Lim | H01L 21/02422 |

OTHER PUBLICATIONS

Jin, Gangtae et al.; "Heteroepitaxial van der Waals semiconductor superlattices"; Nature Nanotechnology, Jul. 15, 2021, pp. 1092-1098, vol. 16, Springer Nature.

Kang, Chan-mo et al.; "Recent progress of organic light-emitting diode microdisplays for augmented reality/virtual reality applications"; Journal of Information Display, 2022; pp. 19-32; vol. 23; Issue 1; Taylor & Francis.

Kim, Jihyun et al.; "All-Solution-Processed Van der Waals Heterostructures for Wafer-Scale Electronics"; Advanced Materials; 2022; pp. 1-13; vol. 34; Issue 12; Wiley Online Library.

Kim, Keun Soo et al.; "Large-scale pattern growth of graphene films for stretchable transparent electrodes"; Nature; Feb. 5, 2009; pp. 706-710, vol. 457; Macmillan Publishers Limited.

Lien, Der-Hsien et al.; "Large-area and bright pulsed electroluminescence in monolayer semiconductors"; Nature Communications; Mar. 26, 2018; pp. 1-27, vol. 9; Article 1229.

Yang, Seong-Jun et al.; "Wafer-Scale Programmed Assembly of One-Atom-Thick Crystals"; Nano Letters; Feb. 4, 2022, pp. 1518-1524, vol. 22, American Chemical Society.

* cited by examiner

DISPLAY DEVICE AND DRIVING METHOD THEREOF

CROSS-REFERENCE TO RELATED APPLICATION

The present application claims priority to and the benefit of Korean Patent Application No. 10-2022-0106428, filed Aug. 24, 2022, the entire content of which is hereby incorporated by reference.

BACKGROUND

1. Field

Embodiments of the present disclosure relate to a display device and a driving method thereof.

2. Description of the Related Art

Recently, a field to which a display device is applied has been gradually expanded. For example, the display device may be applied to various systems for realizing virtual reality. Accordingly, a display device including pixels having higher resolution may be required or desired.

Meanwhile, studies on two-dimensional (2D) materials having a 2D planar structure and a bandgap energy are being actively conducted. In the course of research, it was confirmed that 2D materials could be used as light emitting elements. Accordingly, there is a desire to sufficiently secure the light efficiency of light emitting elements using 2D materials, and research on an efficient driving method is desired.

SUMMARY

An object of embodiments of the disclosure is to provide a display device having high resolution and excellent luminous efficiency, and a driving method thereof.

A display device according to one or more embodiments of the disclosure may include a pixel circuit layer including a base layer and circuit elements on the base layer; and a display layer on the pixel circuit layer. The display layer may include a first electrode on the pixel circuit layer; an insulating layer on the first electrode; a second electrode on the insulating layer; a light emitting stacked structure on the second electrode and including a first insulating layer, a second insulating layer, and a light emitting layer between the first insulating layer and the second insulating layer; and a third electrode on the light emitting stacked structure. The light emitting layer may include a two-dimensional material, may be separated from the second electrode by the first insulating layer, and may be separated from the third electrode by the second insulating layer.

According to one or more embodiments, the display device may further include sub-pixels each including the pixel circuit layer and the display layer and emitting light of different colors. The circuit elements may include a driving transistor electrically connected to the first electrode. First electrodes of the sub-pixels may be electrically separated from each other.

According to one or more embodiments, the first electrode and the second electrode may be configured to form an electric field that controls a concentration of charge carriers in the light emitting layer.

According to one or more embodiments, the first electrode may include a reflective surface facing the light emitting layer.

According to one or more embodiments, the second electrode may form a ground potential.

According to one or more embodiments, the second electrode may be over the sub-pixels.

According to one or more embodiments, the third electrode may be electrically connected to a pulse line that supplies an AC pulse signal.

According to one or more embodiments, the third electrode may be over the sub-pixels.

According to one or more embodiments, the second electrode and the third electrode may be spaced apart from each other with a region interposed therebetween in a plan view.

According to one or more embodiments, the second electrode may include a root electrode over the sub-pixels and branch electrodes extending inside each of the sub-pixels from the root electrode.

According to one or more embodiments, the first insulating layer and the second insulating layer may include h-BN (Hexagonal Boron Nitride). The light emitting layer may include a transition metal dichalcogenide (TMDC) material.

According to one or more embodiments, the TMDC material may include one or more transition metals selected from the group consisting of Mo, W, Nb, V, Ta, Ti, Zr, Hf, Tc, Cu and Re and one or more chalcogen elements selected from the group consisting of S, Se, and Te.

According to one or more embodiments, the sub-pixels may emit light of different colors without color filters.

According to one or more embodiments, light emitting layers included in the sub-pixels may include different two-dimensional materials.

According to one or more embodiments, the sub-pixels may form a pixel unit. A size of the pixel unit may be 5 µm or less.

According to one or more embodiments, the display device may further include a half mirror layer on the third electrode.

In a driving method of a display device according to one or more embodiments of the disclosure, the display device may include a first electrode, a second electrode, a third electrode, and a light emitting stacked structure including a first insulating layer, a second insulating layer, and a light emitting layer between the first insulating layer and the second insulating layer and including a two-dimensional material, and the driving method may include controlling a concentration of charge carriers in the light emitting layer; and emitting light from the light emitting layer. The controlling the concentration of the charge carriers may include supplying a driving signal to the first electrode; and forming a ground potential in the second electrode. The emitting light from the light emitting layer may include supplying an AC pulse signal to the third electrode; and forming the ground potential in the second electrode.

According to one or more embodiments, the controlling the concentration of the charge carriers in the light emitting layer may be performed within a first time period. The emitting light from the light emitting layer may be performed within a second time period. The second time period may be after the first time period.

According to one or more embodiments, the display device may include sub-pixels each including the first electrode, the second electrode, the third electrode, and the light emitting stacked structure. The supplying the AC pulse signal to the third electrode may include concurrently (e.g., simultaneously) supplying the AC pulse signal to the third electrode of each of the sub-pixels.

According to one or more embodiments, the controlling the concentration of the charge carriers may include forming an electric field with respect to the light emitting layer by the first electrode and the second electrode. The emitting light from the light emitting layer may include forming an electric field with respect to the light emitting layer by the second electrode and the third electrode.

BRIEF DESCRIPTION OF THE DRAWINGS

The accompanying drawings, which are included to provide a further understanding of the subject matter of the present disclosure, and are incorporated in and constitute a part of this specification, illustrate embodiments of the present disclosure, and, together with the description, serve to explain principles of embodiments of the present disclosure.

DETAILED DESCRIPTION

As the present disclosure allows for various changes and numerous embodiments, example embodiments will be illustrated in the drawings and described in more detail in the detailed description. However, this is not intended to limit the disclosure to particular modes of practice, and it is to be appreciated that all changes, equivalents, and substitutes that do not depart from the spirit and technical scope of the disclosure are encompassed in the disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element. In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof. In addition, when a first part such as a layer, film, region, plat, etc. is "on" a second part, the first part may be not only "directly on" the second part but a third part may intervene between them. Furthermore, in the disclosure, when a first part such as a layer, film, region, plat, etc. is formed on a second part, a direction in which the first part is formed is not limited to an upper direction of the second part, but may include a side or a lower direction of the second part. To the contrary, when a first part such as a layer, film, region, plat, etc. is "under" a second part, the first part may be not only "directly under" the second part but a third part may intervene between them.

The disclosure relates to a display device and a driving method thereof. Hereinafter, a display device according to embodiments will be described with reference to the accompanying drawings.

Figure 1:
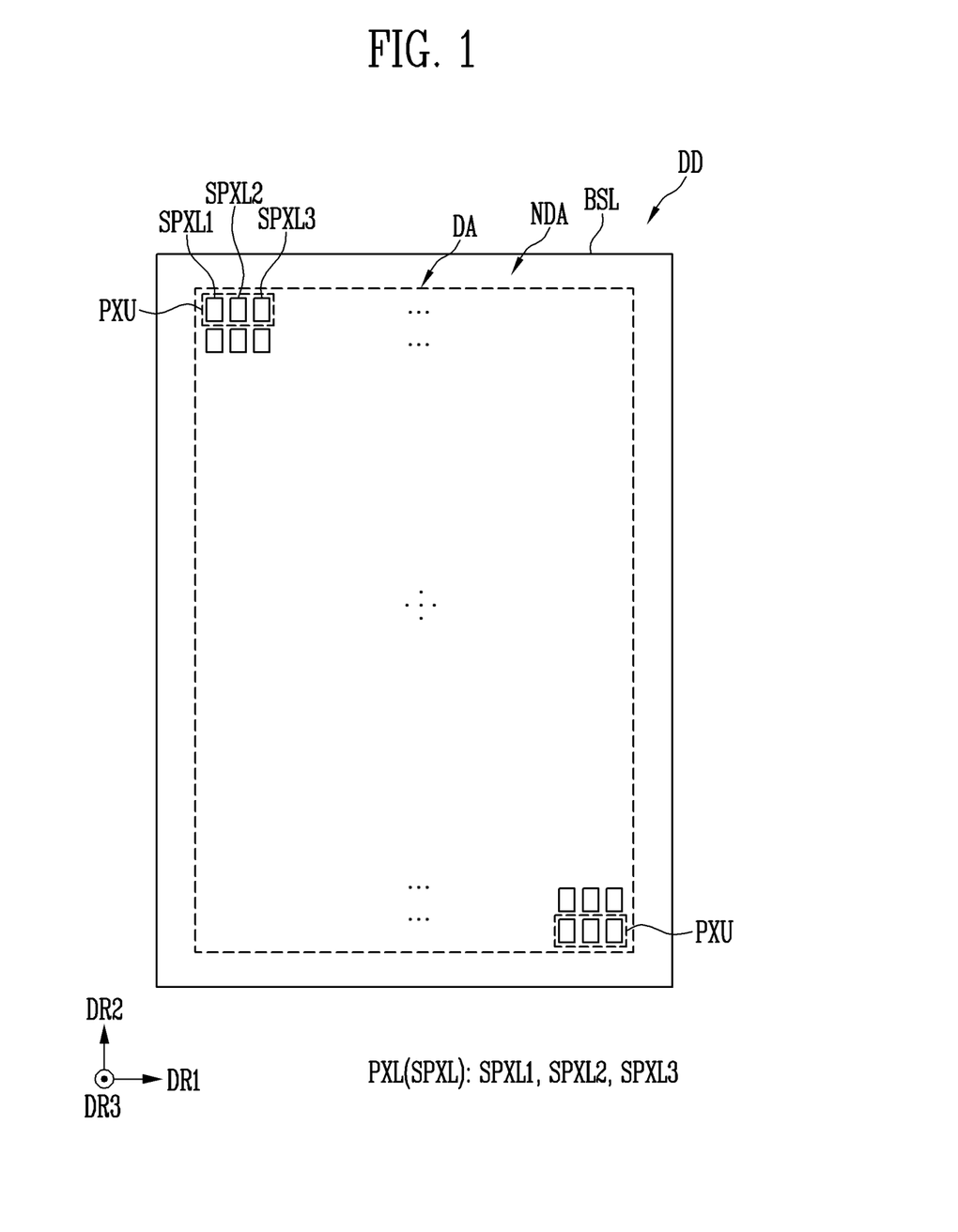
FIG. 1 is a plan view schematically illustrating a display device according to one or more embodiments.

FIG. 1 is a plan view schematically illustrating a display device according to one or more embodiments.

A display device DD may be configured to emit light. According to one or more embodiments, the display device DD may be provided in various suitable forms. For example, the display device DD may be applied to a smart phone, a laptop computer, a tablet PC, a wearable device (for example, a head mounted device, a smart watch, smart glasses, etc.), a television, an infotainment system for a vehicle, and/or the like, and may be applied to various other suitable embodiments. In some embodiments, the display device DD according to embodiments may be manufactured to include pixels PXL having high resolution. Accordingly, the display device DD may be suitable for application to electronic devices requiring or having high resolution. For example, the display device DD may be an augmented reality (AR) device and/or a virtual reality (VR) device.

Referring to FIG. 1, the display device DD may include a base layer BSL and a pixel PXL on the base layer BSL. The display device DD may further include a driving circuit unit (for example, a scan driver and a data driver) for driving the pixel PXL, wirings, and pads.

The display device DD may include a display area DA and a non-display area NDA. The non-display area NDA may mean an area other than the display area DA. The non-display area NDA may surround at least a portion of the display area DA.

The base layer BSL may form a base member of the display device DD. The base layer BSL may be a rigid or flexible substrate or film. For example, the base layer BSL may be a rigid substrate made of glass and/or tempered glass, a flexible substrate (or thin film) made of plastic and/or metal, and/or at least one insulating layer. The material and/or properties of the base layer BSL are not particularly limited. According to one or more embodiments, the base layer BSL may be substantially transparent. Here, the expression "substantially transparent" may mean that at least a portion of light can be transmitted. In another embodiment, the base layer BSL may be translucent or opaque. Also, the base layer BSL may include a reflective material according to embodiments.

The display area DA may be an area in which the pixel PXL is located. The non-display area NDA may be an area in which the pixel PXL is not located. The driving circuit unit, the wirings, and the pads connected to the pixel PXL of the display area DA may be in the non-display area NDA.

According to one or more embodiments, the pixel PXL (or sub-pixels SPXL) may be arranged according to a stripe or PENTILE® arrangement structure (e.g., an RGBG matrix, RGBG structure, or RGBG matrix structure). However, the disclosure is not limited thereto. PENTILE® is a duly registered trademark of Samsung Display Co., Ltd.

According to one or more embodiments, the pixel PXL (or the sub-pixels SPXL) may include a first sub-pixel SPXL1, a second sub-pixel SPXL2, and a third sub-pixel SPXL3. The first sub-pixel SPXL1, the second sub-pixel SPXL2, and the third sub-pixel SPXL3 may form one pixel unit PXU capable of emitting light of various suitable colors.

For example, each of the first sub-pixel SPXL1, the second sub-pixel SPXL2, and the third sub-pixel SPXL3 may emit light of one color. For example, the first sub-pixel SPXL1 may be a red pixel emitting red (for example, a first color) light, the second sub-pixel SPXL2 may be a green pixel emitting green (for example, a second color) light, and the third sub-pixel SPXL3 may be a blue pixel emitting blue (for example, a third color) light. The colors, types (or kinds), and/or the number of the first sub-pixel SPXL1, the second sub-pixel SPXL2, and the third sub-pixel SPXL3 constituting each pixel unit PXU are not limited to specific examples.

Figure 2:
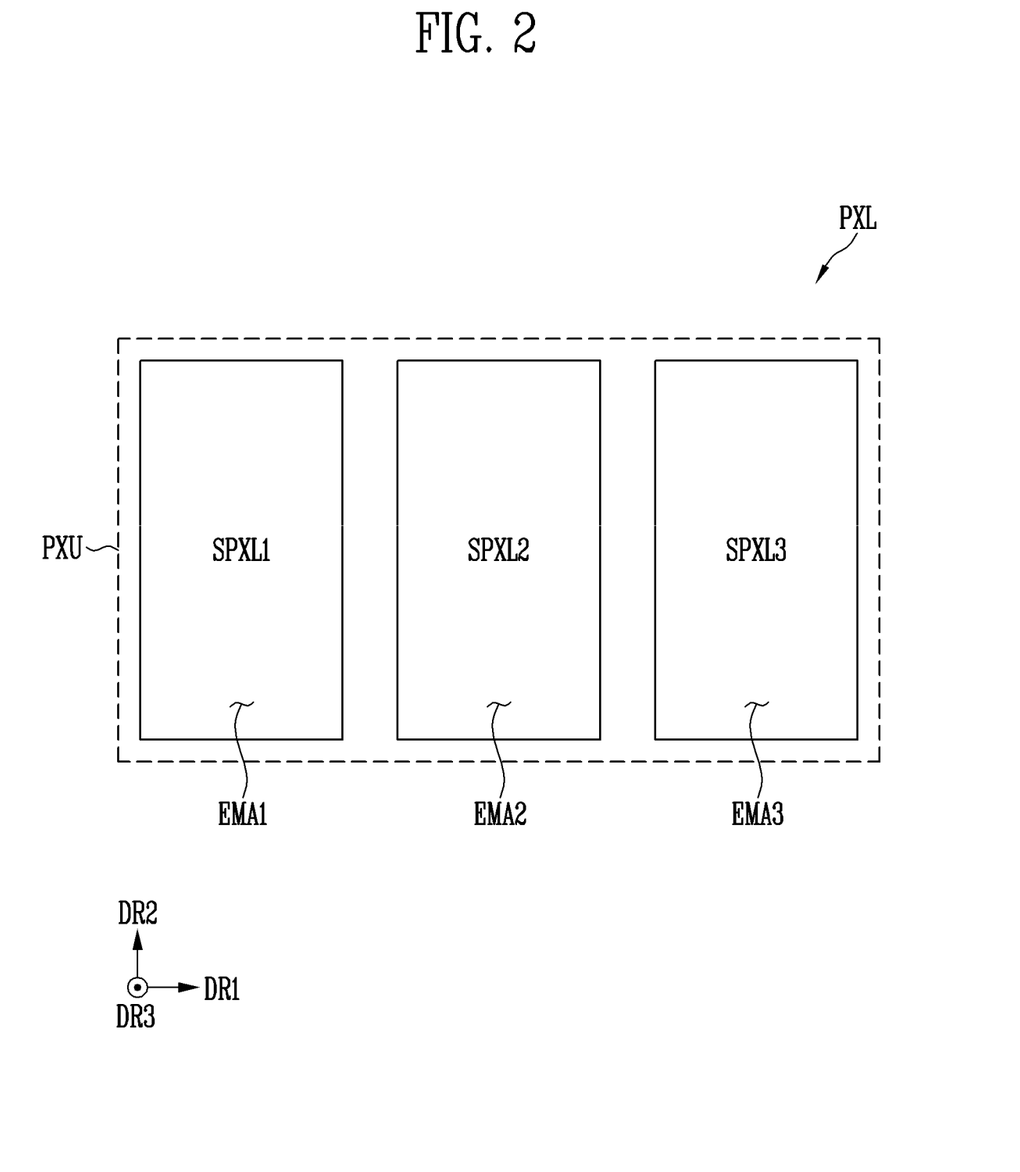
FIG. 2 is a plan view schematically illustrating a pixel according to one or more embodiments.

FIG. 2 is a plan view schematically illustrating a pixel according to one or more embodiments.

Referring to FIG. 2, the sub-pixels SPXL1, SPXL2, and SPXL3 forming the pixel unit PXU may include emission areas EMA1, EMA2, and EMA3, respectively. For example, each of the sub-pixels SPXL1, SPXL2, and SPXL3 may include a light emitting stacked structure LS (refer to FIG. 3) configured to emit light of one color.

The first sub-pixel SPXL1 may include a first emission area EMA1 from which light of the first color is emitted. For example, the light emitting stacked structure LS included in the first sub-pixel SPXL1 may be configured to emit light of the first color.

The second sub-pixel SPXL2 may include a second emission area EMA2 from which light of the second color is emitted. For example, the light emitting stacked structure LS included in the second sub-pixel SPXL2 may be configured to emit light of the second color.

The third sub-pixel SPXL3 may include a third emission area EMA3 from which light of the third color is emitted. For example, the light emitting stacked structure LS included in the third sub-pixel SPXL3 may be configured to emit light of the third color.

According to one or more embodiments, characteristics (for example, grayscale, etc.) of light emitted by the light emitting stacked structure LS of each of the sub-pixels SPXL1, SPXL2, and SPXL3 may be suitably or appropriately controlled by forming an electric field adjacent to a light emitting layer EL. This will be described in more detail below.

According to one or more embodiments, in order to realize the display device DD having high resolution, the display device DD may include the light emitting stacked structure LS including a two-dimensional (2D) material. Accordingly, a large number of pixels PXL may be arranged in the display area DA. Hereinafter, features of the display device DD will be described with a focus on the light emitting stacked structure LS.

Figure 3:
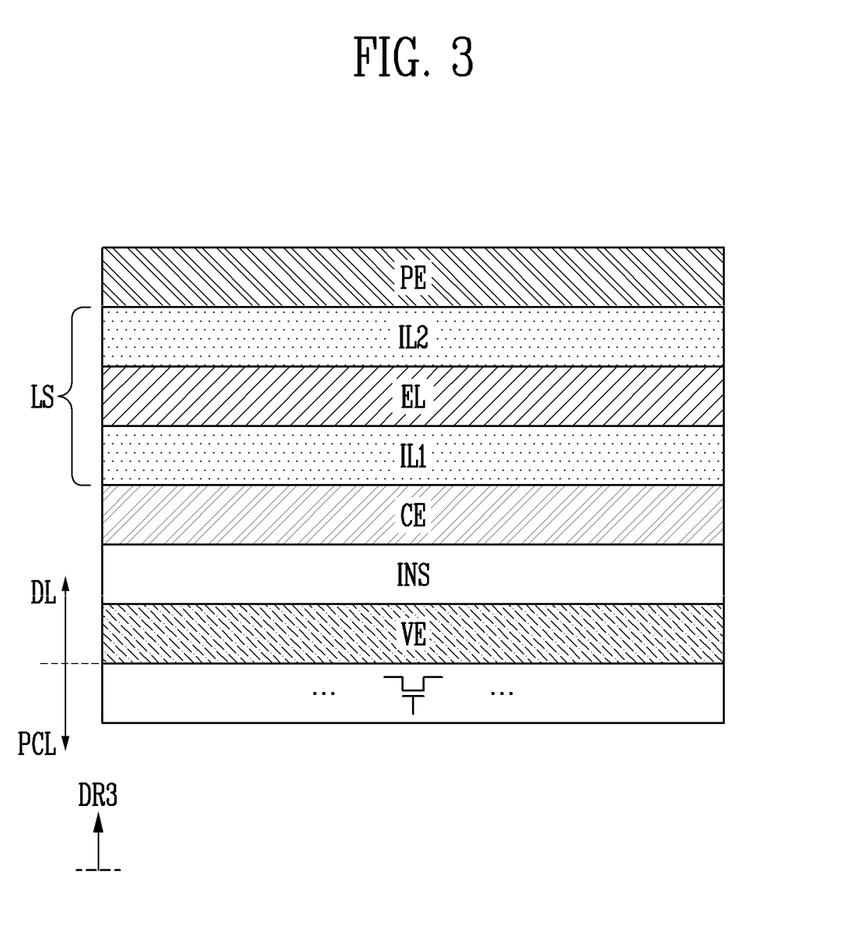
FIG. 3 is a cross-sectional view schematically illustrating the display device according to one or more embodiments.
Figure 4:
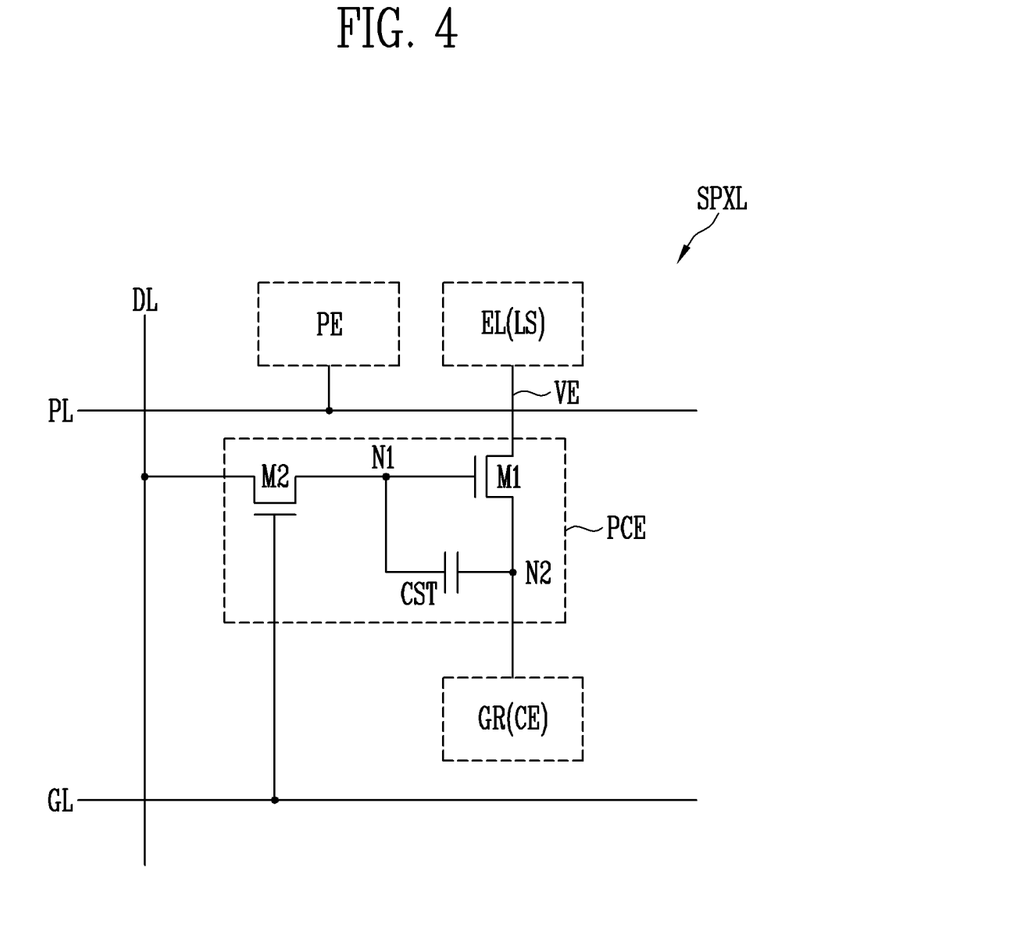
FIG. 4 is a circuit diagram schematically illustrating a pixel circuit included in a sub-pixel according to one or more embodiments.

First, a light emitting mechanism of the pixel PXL (or sub-pixel SPXL) including a stacked structure and the light emitting stacked structure LS of the display device DD will be described with reference to FIGS. 3 and 4. FIG. 3 is a cross-sectional view schematically illustrating the display device according to one or more embodiments. FIG. 4 is a circuit diagram schematically illustrating a pixel circuit included in a sub-pixel according to one or more embodiments.

Referring to FIG. 3, the stacked structure included in the display device DD may include a pixel circuit layer PCL and a display layer DL.

The pixel circuit layer PCL may include a base layer BSL, circuit elements PCE (refer to FIG. 4) on the base layer BSL and driving the pixel PXL (or the sub-pixel SPXL), and wirings electrically connected to the circuit elements PCE. For example, the pixel circuit layer PCL may include one or more transistors M1, M2, and M3 and a storage capacitor CST.

The display layer DL may be on the pixel circuit layer PCL and may include a layer from which light is emitted. The display layer DL may include the light emitting stacked structure LS.

According to one or more embodiments, the display layer DL may include a first electrode VE, an insulating layer INS, a second electrode CE, the light emitting stacked structure LS, and a third electrode PE. According to one or more embodiments, the display layer DL may include a structure in which the above-described layers are sequentially stacked. The light emitting stacked structure LS may include a first insulating layer IL1, a light emitting layer EL, and a second insulating layer IL2.

The first electrode VE may be on the pixel circuit layer PCL. The first electrode VE may be electrically separated from the second electrode CE by the insulating layer INS.

The first electrode VE may be electrically connected to a driving transistor (for example, a first transistor M1) for driving the pixel PXL (or the sub-pixel SPXL). The first electrode VE may include a conductive material (e.g., an electrically conductive material) to receive an electrical signal for realizing the grayscale of the light emitting layer EL.

According to one or more embodiments, the first electrode VE may be a reflective electrode including a reflective conductive material. For example, the first electrode VE may include a reflective surface facing the light emitting layer EL. The first electrode VE may be configured to reflect light emitted from the light emitting layer EL, so that the light can be recycled (e.g., reflected) and light emitting efficiency of the display device DD can be improved.

According to one or more embodiments, the first electrode VE may include one or more selected from the group consisting of gold (Au), silver (Ag), aluminum (Al), molybdenum (Mo), chromium (Cr), titanium (Ti), nickel (Ni), neodymium (Nd), copper (Cu), and platinum (Pt). However, the disclosure is not limited to the above-described examples.

The insulating layer INS may be between the first electrode VE and the second electrode CE, and may electrically separate the first electrode VE and the second electrode CE. The insulating layer INS may cover the first electrode VE. Accordingly, even when an electrical signal (for example, an AC pulse signal S3 (refer to FIG. 9)) is supplied to the third electrode PE, the first electrode VE may maintain a pixel potential.

According to one or more embodiments, the insulating layer INS may include an inorganic material. For example, the insulating layer INS may include one or more selected from the group consisting of silicon nitride (SiNx), silicon oxide (SiOx), silicon oxynitride (SiOxNy), and aluminum oxide (AlOx). However, the disclosure is not limited to the above-described examples.

The second electrode CE may be between the insulating layer INS and the first insulating layer IL1. The second electrode CE may be electrically separated from the light emitting layer EL by the first insulating layer IL1.

The second electrode CE may be a ground electrode GR. For example, the second electrode CE may form a potential different from that of the first electrode VE. The second electrode CE may receive a ground signal S2 (refer to FIG. 9) and form a ground potential.

According to one or more embodiments, the second electrode CE may include a conductive material (e.g., an electrically conductive material). The second electrode CE may include one or more selected from the group consisting of gold (Au), silver (Ag), aluminum (Al), molybdenum (Mo), chromium (Cr), titanium (Ti), nickel (Ni), neodymium (Nd), copper (Cu), and platinum (Pt). However, the disclosure is not limited to the above-described examples.

The first insulating layer IL1 may be between the second electrode CE and the light emitting layer EL, and may physically separate the second electrode CE and the light emitting layer EL. The second insulating layer IL2 may be between the third electrode PE and the light emitting layer EL, and may physically separate the third electrode PE and the light emitting layer EL.

According to one or more embodiments, each of the first insulating layer IL1 and the second insulating layer IL2 may include hexagonal boron nitride (h-BN). According to one or more embodiments, the h-BN may be an insulator (e.g., an electrical insulator) having a 2D structure, may not have unsaturated bonds, and may have a generally flat surface. Accordingly, when the light emitting layer EL including the 2D material is on one surface of each of the first insulating layer IL1 and the second insulating layer IL2, excellent charge mobility in the light emitting layer EL can be defined by the h-BN.

The light emitting layer EL may be between the first insulating layer IL1 and the second insulating layer IL2. The light emitting layer EL may include the 2D material. According to one or more embodiments, the light emitting layer EL may include a transition metal dichalcogenide (TMDC) material. For example, the TMDC material may include one or more transition metals selected from the group consisting of Mo, W, Nb, V, Ta, Ti, Zr, Hf, Tc, Cu, and Re and one or more chalcogen elements selected from the group consisting of S, Se, and Te. According to one or more embodiments, the 2D material may be one or more selected from the group consisting of $WSe_2$, $MoSe_2$, and $MoS_2$.

The light emitting stacked structure LS may have a 2D material-based heterostructure. For example, the light emitting layer EL and the first and second insulating layers IL1 and IL2 may include the 2D material-based heterostructure in which the TMDC material is interposed between h-BN layers. For example, according to the light emitting stacked structure LS, a quantum well structure including a barrier formed by the h-BN layers and a well formed by the TMDC material may be provided.

The light emitting layer EL may emit light of various suitable colors. The color of the light emitted by the light emitting layer EL may be determined according to the type (or kind) and dopant of the 2D material included in the light emitting layer EL. For example, in order for the first sub-pixel SPXL1 to emit light of the first color, the light emitting layer EL of the first sub-pixel SPXL1 may include a first 2D material. In order for the second sub-pixel SPXL2 to emit light of the second color, the light emitting layer EL of the second sub-pixel SPXL2 may include a second 2D material. In order for the third sub-pixel SPXL3 to emit light of the third color, the light emitting layer EL of the third sub-pixel SPXL3 may include a third 2D material.

The light emitting stacked structure LS may be patterned using various suitable methods. For example, a dry etching method, a wet etching method, and/or the like may be used to form the light emitting stacked structure LS. However, the disclosure is not limited to the above-described examples.

The third electrode PE may be a pulse electrode to which the AC pulse signal S3 may be supplied. For example, the third electrode PE may receive the AC pulse signal S3 when the light emitting layer EL emits light.

According to one or more embodiments, the third electrode PE may include a conductive material (e.g., an electrically conductive material). According to one or more embodiments, the third electrode PE may include a transparent conductive material (e.g., a transparent electrically conductive material). For example, the third electrode PE may include one or more selected from the group consisting of indium tin oxide (ITO), indium zinc oxide (IZO), and indium tin zinc oxide (ITZO). However, the disclosure is not limited to the above-described examples.

The light emitting stacked structure LS (or the light emitting layer EL) may emit light using an intrinsic electroluminescence method. For example, in the light emitting layer EL, electrons may be accelerated based on an electric field formed adjacent to the light emitting layer EL. An impact excitation phenomenon in which the accelerated electrons collide with an arbitrary luminescent center may occur, and excitons may be generated during the impact excitation process. According to one or more embodiments, the light emitting stacked structure LS including the 2D material may control electro-luminescence by using a method using impact excitation, and thus, may have high light efficiency.

According to one or more embodiments, an aspect in which light is emitted in the light emitting stacked structure LS may be controlled based on an electrical signal supplied to each of the first to third electrodes VE, CE, and PE. In this regard, it will be described with reference to FIG. 4 together.

Referring to FIG. 4, the sub-pixel SPXL may include one or more circuit elements PCE and wirings connected thereto. The sub-pixel SPXL may be driven by one or more circuit elements PCE.

According to one or more embodiments, the sub-pixel SPXL may include the circuit elements PCE, a data line DL, a gate line GL, and a pulse line PL.

The circuit elements PCE may be electrically connected to the first electrode VE that is a pixel electrode for the light emitting stacked structure LS (or the light emitting layer EL). The circuit elements PCE may be electrically connected to the gate line GL to which a gate signal is supplied and the data line DL to which a data signal is supplied.

The circuit elements PCE may include a first transistor M1, a second transistor M2, and a storage capacitor CST.

The first transistor M1 may be electrically connected between the first electrode VE and a second node N2. The second node N2 may be a node to which the circuit elements PCE and the ground electrode GR formed by the second electrode CE are connected. A gate electrode of the first transistor M1 may be electrically connected to a first node N1. The first transistor M1 may control a driving current supplied to the first electrode VE, which is the pixel electrode, in response to a voltage of the first node N1. The first transistor M1 may be a driving transistor.

The second transistor M2 may be electrically connected between the first node N1 and the data line DL. A gate electrode of the second transistor M2 may be electrically connected to the gate line GL. The second transistor M2 may be turned on when the gate signal of a gate-on voltage (for example, a high level voltage) is supplied from the gate line GL to electrically connect the data line DL and the first node N1.

The data signal of a corresponding frame may be supplied to the data line DL for each frame period, and the data signal may be transmitted to the first node N1 through the second transistor M2 while a scan signal of a gate-on voltage is supplied. The second transistor M2 may be a switching transistor for supplying each data signal to the sub-pixel SPXL.

One electrode of the storage capacitor CST may be electrically connected to the first node N1, and the other electrode of the storage capacitor CST may be electrically connected to the second node N2. The storage capacitor CST may be charged with a voltage corresponding to the data signal supplied to the first node N1 during each frame period.

The pulse line PL may be electrically connected to the third electrode PE to supply the AC pulse signal S3 to the third electrode PE. A direction in which the pulse line PL extends is not particularly limited.

According to one or more embodiments, when a corresponding electrical signal is supplied to the first electrode VE functioning as the pixel electrode, the first electrode VE and the second electrode CE may form an electric field with respect to the light emitting stacked structure LS (or the light emitting layer EL). For example, the first electrode VE and the second electrode CE may form the electric field corresponding to a voltage supplied to the first electrode VE, an electric field effect may occur in the light emitting layer EL including the 2D material, and the concentration of charge carriers CC (refer to FIG. 10) in the light emitting layer EL may be controlled based on the electric field effect. In addition, the third electrode PE may receive the AC pulse signal S3 from the pulse line PL, an electric field may be formed between the second electrode CE and the third electrode PE according to the AC pulse signal S3 so that the charge carriers CC may be accelerated in the light emitting layer EL, and accelerated electrons may form the excitons by causing luminescence excitation phenomenon with the arbitrary luminescent center. The formed excitons may be converted into photons and may emit light energy.

According to one or more embodiments, characteristics (for example, grayscale, etc.) of light emitted by the light emitting layer EL may be determined according to the electric field formed by the first electrode VE and the second electrode CE. For example, by controlling the electrical signal supplied to the first electrode VE, the characteristics of the emitted light can be adjusted.

In addition, according to one or more embodiments, a time period in which the concentration of the charge carriers CC in the light emitting layer EL can be controlled and a time period in which the charge carriers CC in the light emitting layer EL are accelerated to generate the impact excitation phenomenon may be distinguished from each other. In this case, the concentration of the charge carriers CC can be precisely controlled.

Next, a planar and cross-sectional structure of the display device DD according to one or more embodiments will be described with reference to FIGS. 5 to 7. Contents that may overlap the above-described contents may not be briefly described or redundantly described here.

Figure 5:
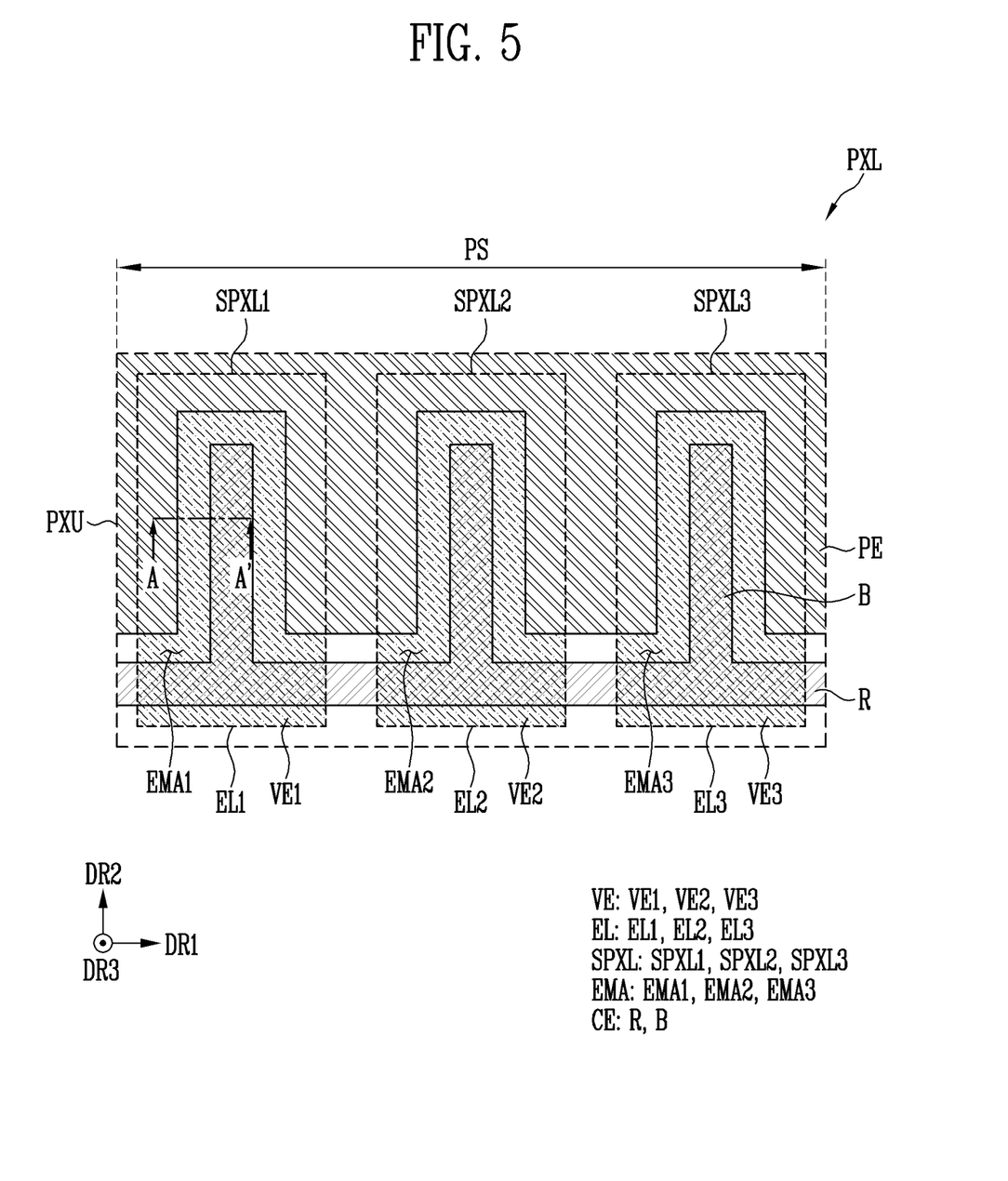
FIG. 5 is a plan view schematically illustrating the pixel according to one or more embodiments.

FIG. 5 is a plan view schematically illustrating the pixel according to one or more embodiments. FIG. 5 illustrates an arrangement structure of the first to third electrodes VE, CE, and PE in addition to the plan view described above with reference to FIG. 2.

Figure 6:
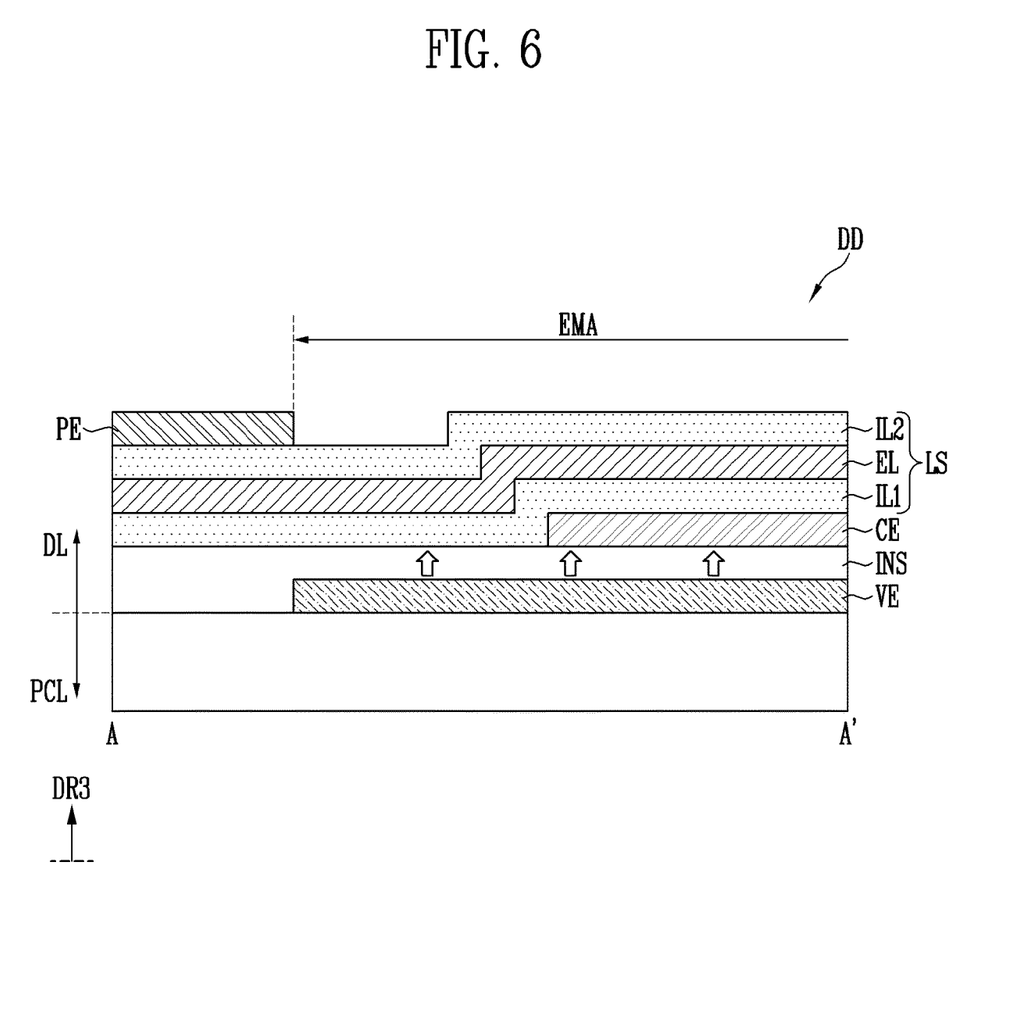
FIGS. 6 and 7 are cross-sectional views schematically illustrating the pixel according to one or more embodiments.
Figure 7:
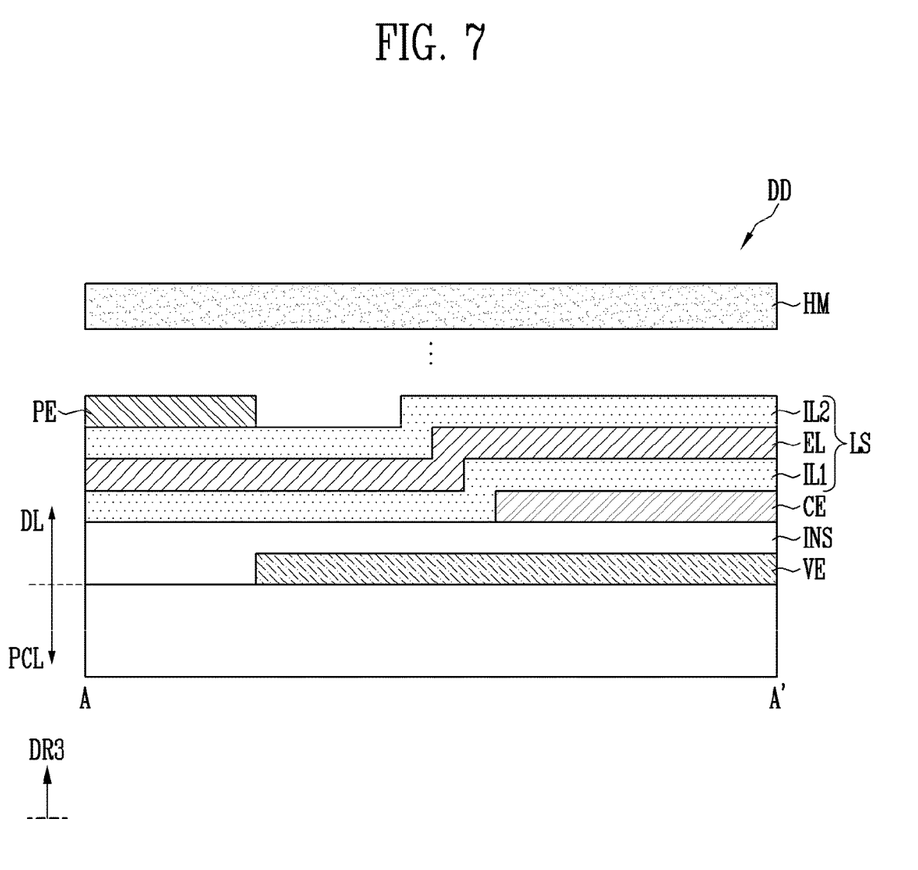

FIGS. 6 and 7 are cross-sectional views schematically illustrating the pixel according to one or more embodiments. FIGS. 6 and 7 are schematic cross-sectional views taken along line A-A' of FIG. 5. For convenience of description, the cutting line in FIGS. 6 and 7 is specified based on the first sub-pixel SPXL1, but features to be described with reference to FIGS. 6 and 7 may be applied to any one of the sub-pixels SPXL. The emission area EMA to be described in FIGS. 6 and 7 may be any one of the first to third emission areas EMA1, EMA2, or EMA3.

Referring to FIGS. 5 and 6, the first electrode VE may correspond to each of the sub-pixels SPXL. For example, the first electrode VE may include a (1-1)th electrode VE1 included in the first sub-pixel SPXL1, a (1-2)th electrode VE2 included in the second sub-pixel SPXL2, and a (1-3)th electrode VE3 included in the third sub-pixel SPXL3.

The first electrode VE may be on the pixel circuit layer PCL and covered by the insulating layer INS. The (1-1)th electrode VE1, the (1-2)th electrode VE2, and the (1-3)th electrode VE3 may be spaced apart from each other to receive different electrical signals. Accordingly, the first to third sub-pixels SPXL1, SPXL2, and SPXL3 may be driven independently of each other.

The first electrode VE may overlap the emission area EMA in a plan view. For example, the first electrode VE may be configured to recycle (e.g., reflect) light emitted from the light emitting layer EL. In addition, the first electrode VE may reflect the light incident on the first electrode VE, and may emit the reflected light in a display direction (for example, a third direction DR3).

According to one or more embodiments, because light may be emitted from a region in which the light emitting layer EL is located, when the third electrode PE includes a transparent conductive material, the emission area EMA may be specified as an entire surface on which the light emitting layer EL is located.

The second electrode CE may be on a partial region of the insulating layer INS. The second electrode CE may function as a common electrode that is patterned across the first to third sub-pixels SPXL1, SPXL2, and SPXL3 to form a ground potential.

The second electrode CE may include a root electrode R patterned across the first to third sub-pixels SPXL1, SPXL2, and SPXL3 and a branch electrode B extending from the root electrode R to the inside of each sub-pixel SPXL. As described above, the AC pulse signal S3 may be supplied to the third electrode PE, and the electric field for accelerating the charge carriers CC of the light emitting layer EL may be formed between the second electrode CE and the third electrode PE. In order to efficiently accelerate the charge carriers CC, a surface where the second electrode CE and the third electrode PE are adjacent to each other needs to be formed to be wide. According to one or more embodiments, the branch electrode B, which is a part of the second electrode CE, may have a shape protruding from the inner region of the sub-pixels SPXL. Accordingly, the second electrode CE and the third electrode PE may form a wide adjacent surface.

According to one or more embodiments, the second electrode CE may be entirely arranged on the pixels PXL formed throughout the display area DA. According to one or more embodiments, the second electrode CE of each of all the pixels PXL in the display area DA may be electrically connected to each other. Accordingly, the second electrode CE may form a common ground potential with respect to the pixels PXL.

According to one or more embodiments, the second electrode CE may be between the first electrode VE and the third electrode PE. Accordingly, when a driving signal is supplied to the first electrode VE to control the concentration of the charge carriers CC, the second electrode CE may form a ground power source for forming the electric field. At the same time, when the AC pulse signal S3 is supplied to the third electrode PE to form the excitons, the second electrode CE may form the ground power source for forming the electric field.

The light emitting layer EL may be in a region where the sub-pixels SPXL are formed. For example, the light emitting layer EL may include a first light emitting layer EL1 included in the first sub-pixel SPXL1 to form the first emission area EMA1, a second light emitting layer EL2 included in the second sub-pixel SPXL2 to form the second emission area EMA2, and a third light emitting layer EL3 included in the third sub-pixel SPXL3 to form the third emission area EMA3. The first to third light emitting layers EL1, EL2, and EL3 may be spaced apart from each other to emit light of different colors, may include different 2D materials, and may include different dopants.

The light emitting layer EL may overlap the first electrode VE in a plan view. According to one or more embodiments, the first electrode VE may have a reflective property, so that light emitted from the light emitting layer EL may be recycled (e.g., reflected).

The first insulating layer IL1 on one surface of the light emitting layer EL may be electrically separated from the second electrode CE. Accordingly, the concentration of the charge carriers CC in the light emitting layer EL may be controlled according to the electric field formed by the first electrode VE and the second electrode CE.

The light emitting layer EL may be between the second electrode CE and the third electrode PE. In this case, as the AC pulse signal S3 is supplied to the third electrode PE, the electric field effect according to the electric field formed by the second electrode CE and the third electrode PE may be strongly generated in the light emitting layer EL.

According to one or more embodiments, the display device DD having high resolution may be implemented by providing the pixel PXL having a size of a micro scale or less. For example, according to one or more embodiments, a light emitting structure may be implemented by using the light emitting layer EL including the 2D material, and a size PS of the pixel PXL may be designed to be very small. According to one or more embodiments, the size PS of the pixel PXL (for example, the pixel unit PXU) may be 5 μm or less. According to one or more embodiments, the size PS of the pixel PXL (for example, the pixel unit PXU) may be 0.1 μm to 1 μm. However, the disclosure is not limited to the above-described examples.

In addition, because the color of the light emitted by the light emitting layer EL may be determined by the type (or kind) and dopant of the 2D material forming the light emitting layer EL, a configuration (for example, a color filter and/or a layer including a color conversion material) that converts the color of the light may not be necessarily required. Accordingly, because process steps can be simplified, and the size PS of the pixel PXL can be designed in units of several micrometers or less, the resolution of the display device DD can be suitably or appropriately determined according to a user who designs the process. Also, as described above, when the size of the pixel PXL is reduced while the configuration that converts the color of the light is patterned, it may be vulnerable to noise such as cross-talk between adjacent pixels PXL, but the display device DD according to embodiments of the disclosure may be robust against such risk.

The third electrode PE may be on a partial region of the second insulating layer IL2. The third electrode PE may be patterned across the first to third sub-pixels SPXL1, SPXL2, and SPXL3 to receive the AC pulse signal S3.

The third electrode PE may be commonly across the first to third sub-pixels SPXL1, SPXL2, and SPXL3. Accordingly, the AC pulse signal S3 may be supplied to the first to third sub-pixels SPXL1, SPXL2, and SPXL3 within the same time period. As described above, the light emitting layer EL may emit light when the AC pulse signal S3 is supplied to the third electrode PE. That is, after a driving signal S1 (refer to FIG. 9) is supplied to the first electrode VE for each of the sub-pixels SPXL and the signal is processed, the AC pulse signal S3 may be supplied to the third electrode PE commonly patterned for the sub-pixels SPXL, so that the sub-pixels SPXL may concurrently (e.g., simultaneously) emit light.

According to one or more embodiments, the third electrode PE may be entirely arranged in the pixels PXL formed throughout the display area DA. According to one or more embodiments, the third electrode PE of each of all the pixels PXL in the display area DA may be electrically connected to each other. As a result, the pixels PXL in the display area DA may emit light concurrently (e.g., substantially simultaneously). However, the disclosure is not limited to the above-described examples. According to one or more embodiments, the third electrode PE may be patterned to be distinguished for each sub-pixel SPXL.

According to one or more embodiments, the third electrode PE may have a shape patterned to correspond to the shape of the branch electrode B of the second electrode CE. For example, the branch electrode B may protrude in one direction, and the third electrode PE may have a shape complementary to (e.g., corresponding to) the protruding shape of the branch electrode B.

According to one or more embodiments, the second electrode CE and the third electrode PE may be spaced apart from each other. A region where the second electrode CE and the third electrode PE are spaced apart from each other may be a region where light is mainly emitted by exposing the light emitting layer EL.

The arrangement of the first to third electrodes VE, CE, and PE according to embodiments is not limited to the specific structure described above, and may be suitably or appropriately changed within the scope of implementing the technical features of the disclosure.

Referring to FIG. 7, the display device DD according to one or more embodiments may further include a half mirror layer HM.

For example, the half mirror layer HM may be on the second insulating layer IL2 and the third electrode PE. The half mirror layer HM may be a layer patterned to overlap the emission area EMA to form a micro-cavity effect. According to one or more embodiments, the half mirror layer HM may include a structure in which a metal thin film and a dielectric film are stacked or a structure in which two or more dielectric films (for example, inorganic films) are stacked. The half mirror layer HM may be configured to transmit light of one color and reflect light of other colors. The half mirror layer HM may constructively interfere with light through the micro-cavity effect to improve light efficiency.

Next, a driving method of the display device DD according to one or more embodiments will be described with reference to FIGS. 8 to 11. Contents that may overlap the above-described contents may not be briefly described or redundantly described here.

Figure 8:
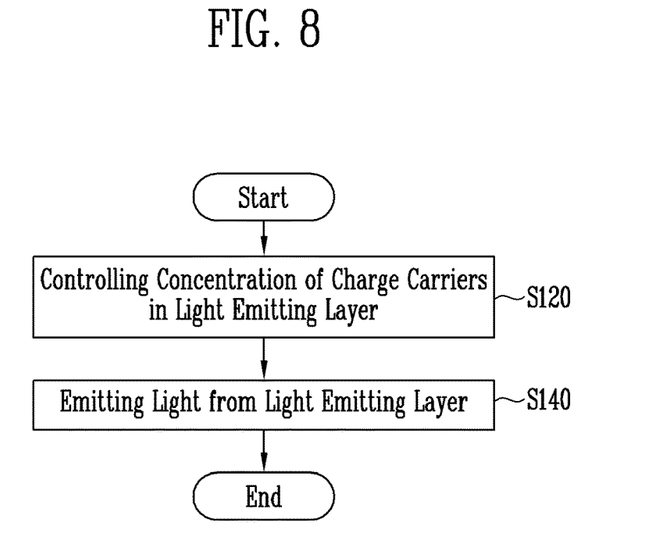
FIG. 8 is a flowchart illustrating a driving method of a display device according to one or more embodiments.
Figure 9:
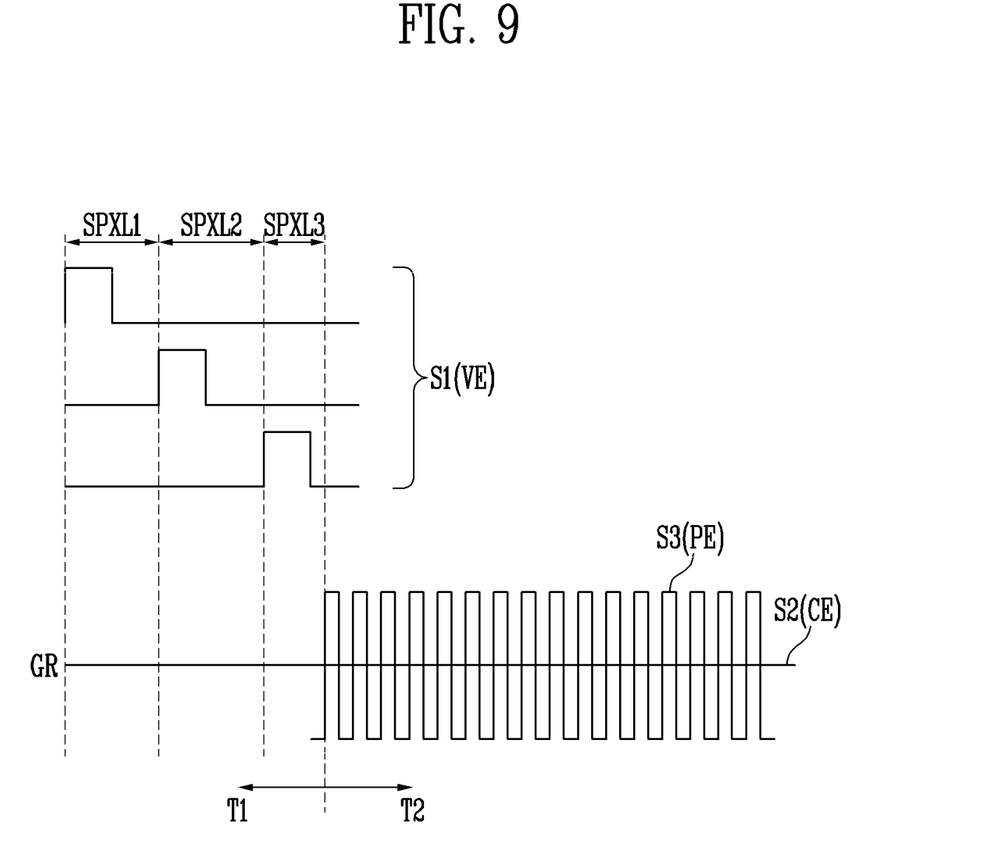
FIG. 9 is a diagram for explaining electrical signals supplied to electrodes according to one or more embodiments.
Figure 10:
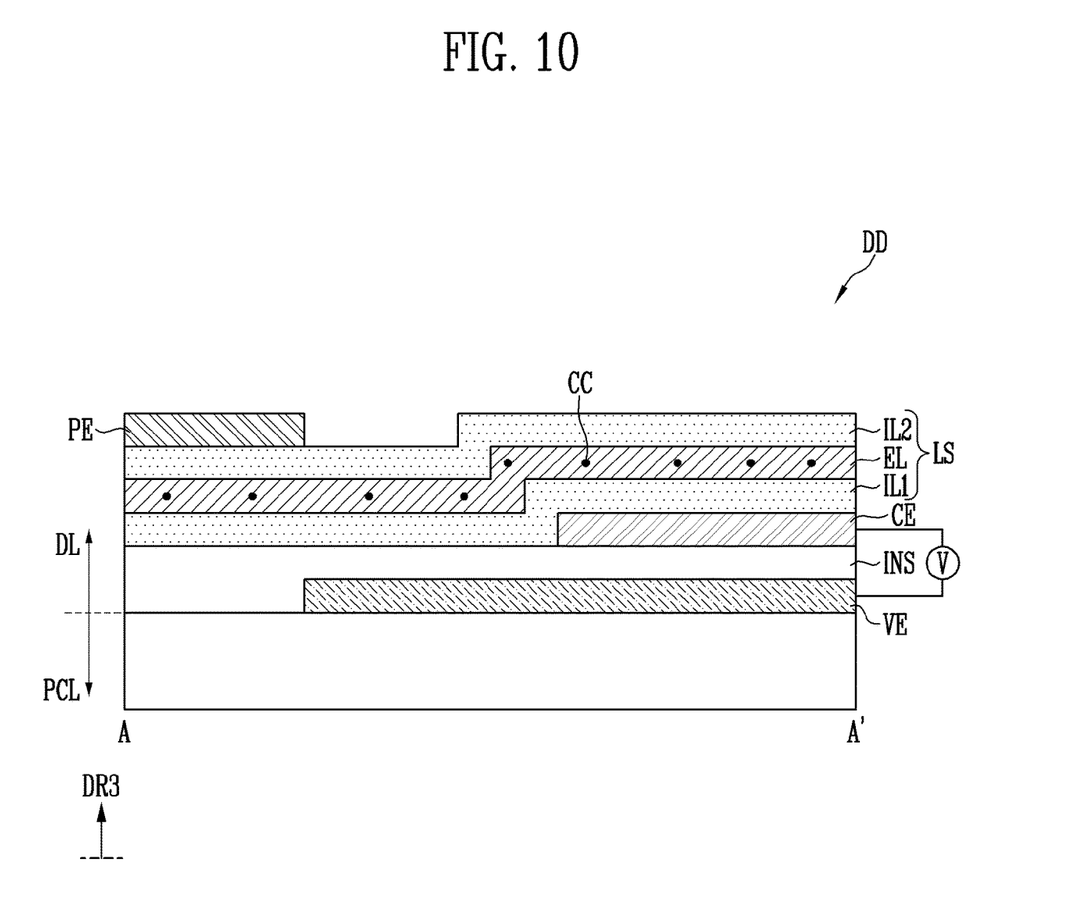
FIGS. 10 and 11 are cross-sectional views schematically illustrating operation steps of the driving method of the display device according to one or more embodiments.
Figure 11:
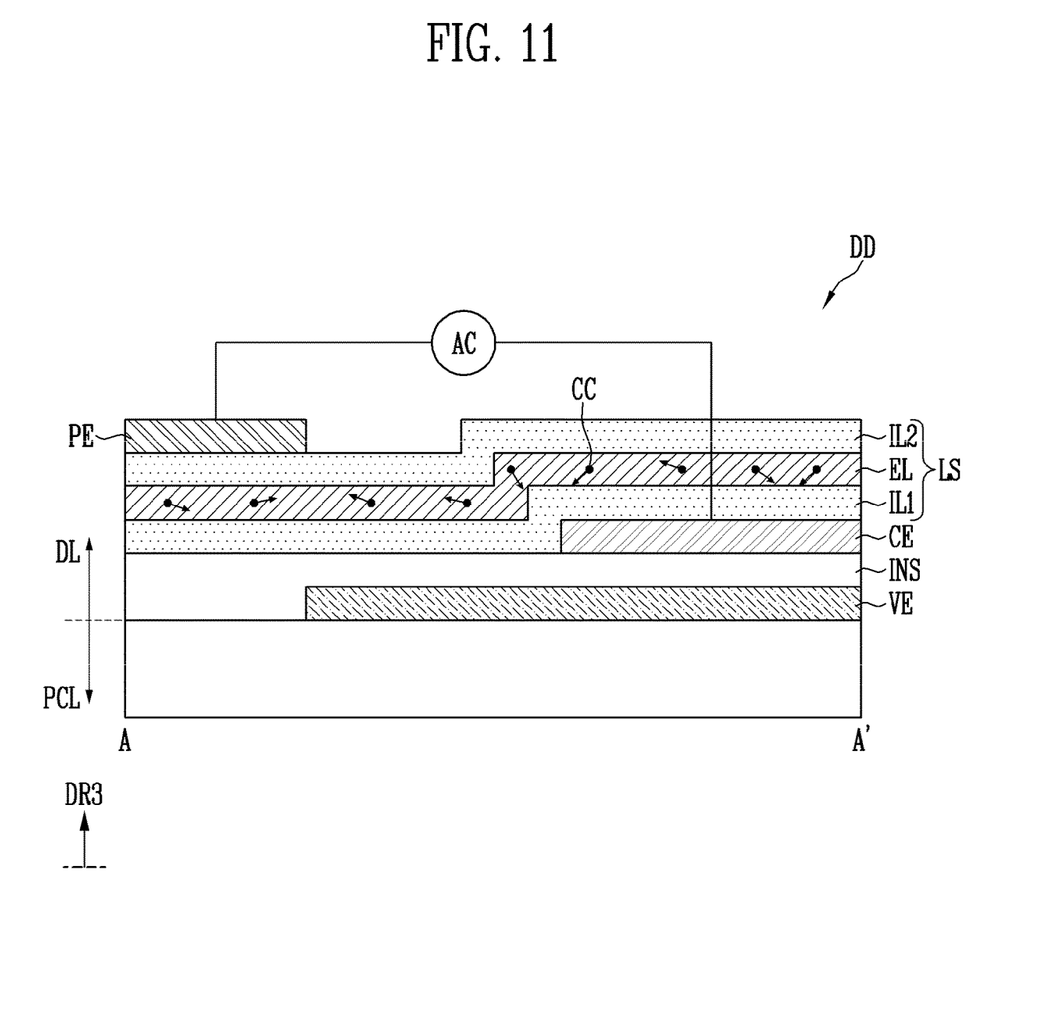

FIG. 8 is a flowchart illustrating a driving method of a display device according to one or more embodiments. FIG. 9 is a diagram for explaining electrical signals supplied to electrodes according to one or more embodiments. FIGS. 10 and 11 are cross-sectional views schematically illustrating operation steps of the driving method of the display device according to one or more embodiments. FIGS. 10 and 11 are illustrated based on the cross-section described above with reference to FIG. 6.

Referring to FIG. 8, the driving method of the display device DD according to one or more embodiments may include controlling the concentration of the charge carriers in the light emitting layer (S120) and emitting light from the light emitting layer (S140).

Referring to FIGS. 8, 9, and 10, in the controlling the concentration of the charge carriers in the light emitting layer (S120), the first electrode VE and the second electrode CE may form the electric field with respect to the light emitting layer EL within a first time period T1.

In this phase, the driving signal S1 may be supplied to the first electrode VE, and the ground signal S2 may be provided to the second electrode CE to form the ground potential. Accordingly, the electric field may be formed adjacent to the first electrode VE and the second electrode CE, and thus, the electric field effect may be applied to the light emitting layer EL. In this case, the concentration of the charge carriers CC may be changed. The driving signal S1 supplied to the first electrode VE may be different according to the characteristics of the light to be subsequently formed.

In this phase, the driving signal S1 may be supplied to each of the sub-pixels SPXL. According to one or more embodiments, the driving signal S1 of a first voltage may be supplied to the first sub-pixel SPXL1, the driving signal S1 of a second voltage may be supplied to the second sub-pixel SPXL2, and the driving signal S1 of a third voltage may be supplied to the third sub-pixel SPXL3. Accordingly, the concentration of the charge carriers CC in each of the first to third sub-pixels SPXL1, SPXL2, and SPXL3 may be determined within a numerical range.

Referring to FIGS. 8, 9, and 11, in the emitting light from the light emitting layer (S140), the third electrode PE and the second electrode CE may form the electric field with respect to the light emitting layer EL within a second time period T2. Here, the second time period T2 may be after the first time period T1.

In this phase, the AC pulse signal S3 may be supplied to the third electrode PE, and the ground signal S2 may be provided to the second electrode CE to form the ground potential. Accordingly, the electric field may be formed adjacent to the third electrode PE and the second electrode CE. Accordingly, excitons may be generated due to impact transition according to acceleration of the charge carriers CC, and the excitons may be dissociated to emit light.

According to one or more embodiments, a time period in which electrical information according to the driving signal is reflected in the light emitting layer EL and a time period in which the light emitting layer EL emits light may be different from each other. For example, after driving signals for the sub-pixels SPXL are defined, the sub-pixels SPXL may provide light. In addition, because the sub-pixels SPXL may emit light when the AC pulse signal S3 is supplied to the third electrode PE that is concurrently (e.g., simultaneously) supplied with the electrical signal in the entire display area DA, light information may be concurrently (e.g., simultaneously) output on the entire display area DA.

As described above, according to the embodiments, the display device DD including the pixels PXL having high resolution may be provided. According to comparative devices, manufacturing an electroluminescent device having a unit of several micrometers or less may be very difficult in terms of process difficulty, and risks such as, for example, cross-talk between adjacent pixels may exist. However, according to embodiments of the present disclosure, the pixel PXL having a very small size can be easily manufactured, and unnecessary loss of light can be prevented or reduced by including a reflective electrode structure in the light emitting structure using the 2D material. In addition, by providing the driving method of the display device DD suitable for the light emitting stacked structure LS that emits light using the impact excitation phenomenon, reliability of the electrical signal for driving the pixel PXL can be improved, and the pixels PXL can be driven concurrently (e.g., simultaneously).

According to the embodiments of the disclosure, a display device having high resolution and excellent luminous efficiency and a driving method thereof can be provided.

As described above, example embodiments of the disclosure have been disclosed through the detailed description and the drawings. However, those skilled in the art or those of ordinary skill in the art will appreciate that various modifications and changes are possible without departing from the spirit and technical scope of the disclosure as set forth in the claims below, and equivalents thereof.

Therefore, the technical protection scope of the disclosure is not limited to the detailed description described in the specification, but should be determined by the appended claims, and equivalents thereof.

What is claimed is:
1. A display device comprising:
a pixel circuit layer comprising a base layer and circuit elements on the base layer; and
a display layer on the pixel circuit layer,
wherein the display layer comprises:
a first electrode on the pixel circuit layer;
an insulating layer on the first electrode;
a second electrode on the insulating layer;
a light emitting stacked structure on the second electrode and comprising a first insulating layer, a second insulating layer, and a light emitting layer between the first insulating layer and the second insulating layer;
a third electrode on the light emitting stacked structure; and
a half mirror layer on the third electrode,
wherein the second electrode comprises a root electrode on the sub-pixels and branch electrodes extending inside each of the sub-pixels from the root electrode, and
wherein the light emitting layer includes a two-dimensional material, is separated from the second electrode by the first insulating layer, and is separated from the third electrode by the second insulating layer.
2. The display device of claim 1, further comprising:
sub-pixels each comprising the pixel circuit layer and the display layer and emitting light of different colors,
wherein the circuit elements comprise a driving transistor electrically connected to the first electrode, and
wherein first electrodes of the sub-pixels are electrically separated from each other.

3. The display device of claim 2, wherein the first electrode and the second electrode are configured to form an electric field that controls a concentration of charge carriers in the light emitting layer.

4. The display device of claim 2, wherein the second electrode forms a ground potential.

5. The display device of claim 4, wherein the second electrode is over the sub-pixels.

6. The display device of claim 4, wherein the third electrode is electrically connected to a pulse line that supplies an AC pulse signal.

7. The display device of claim 6, wherein the third electrode is over the sub-pixels.

8. The display device of claim 2, wherein the second electrode and the third electrode are spaced apart from each other with a region interposed therebetween in a plan view.

9. The display device of claim 2, wherein the sub-pixels emit light of different colors without color filters.

10. The display device of claim 9, wherein light emitting layers included in the sub-pixels comprise different two-dimensional materials.

11. The display device of claim 2, wherein the sub-pixels form a pixel unit, and a size of the pixel unit is 5 µm or less.

12. The display device of claim 1, wherein the first electrode comprises a reflective surface facing the light emitting layer.

13. The display device of claim 1, wherein the first insulating layer and the second insulating layer comprise h-BN (Hexagonal Boron Nitride), and
wherein the light emitting layer comprises a transition metal dichalcogenide (TMDC) material.

14. The display device of claim 13, wherein the TMDC material comprises one or more transition metals selected from the group consisting of Mo, W, Nb, V, Ta, Ti, Zr, Hf, Tc, Cu and Re and one or more chalcogen elements selected from the group consisting of S, Se, and Te.

15. A driving method of a display device comprising a first electrode, a second electrode, a third electrode, a half mirror layer on the third electrode, and a light emitting stacked structure comprising a first insulating layer, a second insulating layer, and a light emitting layer between the first insulating layer and the second insulating layer and comprising a two-dimensional material, the driving method comprising:
controlling a concentration of charge carriers in the light emitting layer; and
emitting light from the light emitting layer,
wherein the controlling the concentration of the charge carriers comprises:
supplying a driving signal to the first electrode; and
forming a ground potential in the second electrode,
wherein the emitting light from the light emitting layer comprises:
supplying an AC pulse signal to the third electrode; and
forming the ground potential in the second electrode, and
wherein the second electrode comprises a root electrode on the sub-pixels and branch electrodes extending inside each of the sub-pixels from the root electrode.

16. The driving method of claim 15, wherein the controlling the concentration of the charge carriers in the light emitting layer is performed within a first time period,
wherein the emitting light from the light emitting layer is performed within a second time period, and
wherein the second time period is after the first time period.

17. The driving method of claim 15, wherein the display device comprises sub-pixels each comprising the first electrode, the second electrode, the third electrode, and the light emitting stacked structure, and
wherein the supplying the AC pulse signal to the third electrode comprises:
concurrently supplying the AC pulse signal to the third electrode of each of the sub-pixels.

18. The driving method of claim 15, wherein the controlling the concentration of the charge carriers comprises:
forming an electric field with respect to the light emitting layer by the first electrode and the second electrode, and
wherein the emitting light from the light emitting layer comprises:
forming an electric field with respect to the light emitting layer by the second electrode and the third electrode.

* * * * *